United States Patent
Sauvinet et al.

(10) Patent No.: US 10,525,512 B2
(45) Date of Patent: Jan. 7, 2020

(54) DEVICE FOR CONVEYING AND RETAINING A GLASS SHEET, PARTICULARLY IN A WASHING FACILITY

(71) Applicant: SAINT-GOBAIN GLASS FRANCE, Courbevoie (FR)

(72) Inventors: Vincent Sauvinet, Grenoble (FR); Thierry Olivier, Thourotte (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 16/091,740

(22) PCT Filed: Apr. 5, 2017

(86) PCT No.: PCT/FR2017/050810
§ 371 (c)(1),
(2) Date: Oct. 5, 2018

(87) PCT Pub. No.: WO2017/174936
PCT Pub. Date: Oct. 12, 2017

(65) Prior Publication Data
US 2019/0151909 A1 May 23, 2019

(30) Foreign Application Priority Data
Apr. 6, 2016 (FR) ..................................... 16 53036

(51) Int. Cl.
*H01L 21/677* (2006.01)
*B65G 49/06* (2006.01)
*B08B 11/04* (2006.01)

(52) U.S. Cl.
CPC ............ *B08B 11/04* (2013.01); *B65G 49/064* (2013.01); *B65G 49/065* (2013.01); *H01L 21/67709* (2013.01); *H01L 21/67784* (2013.01)

(58) Field of Classification Search
CPC .. B65G 2207/06; B65G 37/00; B65G 49/065; B65G 51/03; B65G 21/2054;
(Continued)

(56) References Cited

U.S. PATENT DOCUMENTS 3,587,273 A * 6/1971 Smith et al. .......... B21C 37/105
72/133
3,805,455 A * 4/1974 Aellig ..................... B24B 9/102
451/190

(Continued)

FOREIGN PATENT DOCUMENTS

DE 10 90 396 B 10/1960
WO WO 2015/000192 A1 1/2015

OTHER PUBLICATIONS

International Search Report as issued in International Patent Application No. PCT/FR2017/050810, dated Jul. 19, 2017.

Primary Examiner — James R Bidwell
(74) Attorney, Agent, or Firm — Pillsbury Winthrop Shaw Pittman LLP

(57) ABSTRACT

A device for conveying and holding a sheet of glass, includes a conveyor and a holder configured to hold a sheet of glass in position, in particular in a horizontal position, wherein the conveyor comprises at least two spaced-apart and parallel lateral conveying systems extending longitudinally in the conveying direction and intended to be positioned in such a way as to support the lateral sides of the sheet of glass, and the holder comprises at least one holding system placed above the lateral conveying systems and above the sheet of glass and intended to limit the amplitude of the movements of the sheet of glass.

21 Claims, 2 Drawing Sheets

Figure 1:
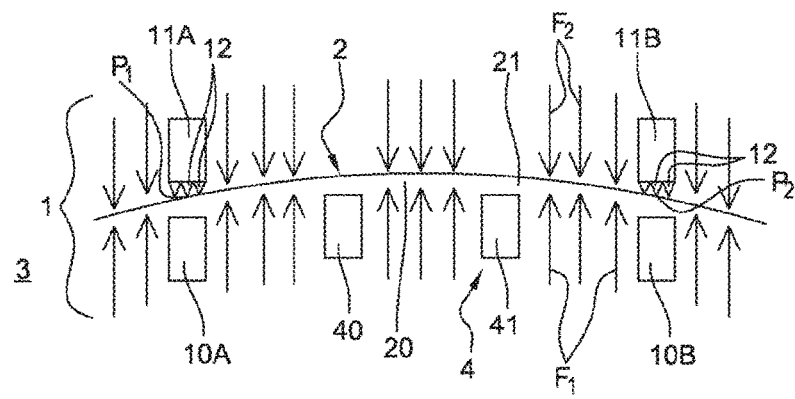

(58) Field of Classification Search
CPC .................. B65G 21/2045; B65G 21/2072; B65G 21/20; B65G 49/064; H01L 21/67784; H01L 21/67706; H01L 21/67709; H01L 21/67721; G02F 1/1303; B24B 9/102; B24B 41/068
USPC .............................................. 198/836.1, 817
See application file for complete search history.

(56) References Cited

U.S. PATENT DOCUMENTS

| | | | | |
|---|---|---|---|---|
| 3,897,869 | A * | 8/1975 | Michael | B65G 25/06 156/433 |
| 4,558,480 | A * | 12/1985 | Okafuji | B08B 11/04 134/6 |
| 5,263,219 | A | 11/1993 | Jibiki | |
| 5,277,246 | A * | 1/1994 | Monch | B65G 15/62 165/120 |
| 5,353,462 | A * | 10/1994 | Ueno | B08B 1/02 15/102 |
| 5,890,579 | A * | 4/1999 | Young | B65G 21/2054 198/459.6 |
| 7,235,002 | B1 * | 6/2007 | Pride | B24B 9/102 451/121 |
| 7,571,801 | B2 * | 8/2009 | Bavelloni | B65G 49/064 198/626.1 |
| 2015/0068867 | A1 * | 3/2015 | Nishimura | H01L 21/67706 198/373 |
| 2016/0264360 | A1 | 9/2016 | Chen et al. | |

\* cited by examiner

DEVICE FOR CONVEYING AND RETAINING A GLASS SHEET, PARTICULARLY IN A WASHING FACILITY

CROSS-REFERENCE TO RELATED APPLICATIONS

This application is the U.S. National Stage of PCT/FR2017/050810, filed Apr. 5, 2017, which in turn claims priority to French patent application number 1653036 filed Apr. 6, 2016. The content of these applications are incorporated herein by reference in their entireties.

The invention relates to a conveying and holding device for a sheet of glass, particularly in a horizontal position, and to a washing facility for sheets of glass comprising such a device.

The invention will be described more particularly with reference to an application of holding, during washing and drying, a sheet of glass intended to be conveyed through the washing and drying facility, without, however, being restricted thereto. It could apply to any application requiring a sheet of glass that is to be conveyed to be held, particularly in a (substantially) horizontal position, before it is integrated into its final end-use.

The invention applies more particularly to a sheet of curved glass, particularly for automotive applications, and of very small thickness, under 1.2 mm or even under 1.1 mm, without, however, being restricted thereto. It may apply to any sheet of planar or non-planar glass and to other types of vehicle or even other applications.

These days reducing the weight of motor vehicles is one of the avenues being explored by motor manufacturers in order in particular to reduce the consumption of fossil fuel of vehicles and therefore reduce the emissions of green house gases ($CO_2$).

Of all the constituent elements of a vehicle, the glazing is one of the components where weight reductions are being sought. One of the steps in reducing the weight of glazing is to reduce the thickness of the glass. Hence, glazings, in particular windshields are now being proposed in which the interior sheet of glass has a thickness of less than 1.2 mm or even less than 1.1 mm, such as of 0.7 mm or 0.55 mm or even 0.4 mm or 0.3 mm.

During the manufacture of laminated glazing, such as automotive glazing, the pair of curved glass sheets that are to be sandwiched together with a film of transparent plastic has to undergo a washing operation in order to avoid the presence of dust which would otherwise carry the risk of becoming entrapped within the laminate, generating visible defects that would not be admissible given the quality imposed in the automotive field, and would lead to the glazing being scrapped.

The cleaning of the curved sheets of glass is usually performed in washing tunnels, the sheets of glass passing one behind the other along a conveying device provided with two parallel and spaced-apart belts, being laid on said belts via their edge, at four points if the sheet of glass is symmetric, or at three points if its contour is asymmetric. Washing and drying are performed over the entire surface area of the two opposite faces of the sheet of glass and on the periphery thereof, by spraying pressurized water jets followed by pressurized air jets, the fact that the sheets of glass are positioned on edge allowing the entire surface and periphery of the sheets of glass to be cleaned.

However, sheets of glass with a thickness of the order of 1.4 mm or less subjected to the pressure of the water and air jets vibrate and deform, the amplitude of the vibrations being considerably increased as the thickness of the glass decreases. Specifically, the amplitude of vibration increases as much as the bending strength of the sheet of glass decreases, in proportion with the cube of the thickness of the sheet of glass.

Thus, vibrations with an amplitude of the order of 20 mm are observed under the effect of the jets of drying air for a sheet of glass of thickness 1.4 mm, and reach respectively 40 mm and even 160 mm for glass with respective thicknesses of 1.1 mm and 0.7 mm. The vibrations cause the glass to knock against the blowing nozzles and generate significant shocks on the edge face of the glass resting on the conveyer belts giving rise to rupture initiators and causing the sheets of glass to break.

Water and air pressure adjustments and nozzle alignments do not make it possible to obtain satisfactory stability or to eliminate impacts for sheets of glass of very small thickness below 1.2 mm. There is too much breakage of the sheets of glass.

It is therefore an object of the invention to propose a device for conveying and holding a sheet of glass which obviates the aforementioned disadvantages while allowing the sheet of glass to be held firmly while it is being conveyed and, in the target application, while it is being washed, while at the same time guaranteeing optimal washing of the surface of the two faces of the sheet of glass, including the periphery of the sheet of glass.

According to the invention, the device for conveying and holding a sheet of glass, comprises conveying means and holding means which are intended to hold a sheet of glass in position, in particular in a (substantially) horizontal position, and is characterized in that the conveying means comprises at least two spaced-apart and parallel conveying systems referred to as lateral conveying systems, extending longitudinally (in the conveying direction), and intended to be positioned in such a way as to support the lateral sides of the sheet of glass, and the holding means comprise at least one holding system placed above the lateral conveying systems and above the sheet of glass and intended to limit the amplitude of the movements of the sheet of glass.

For preference, the holding means comprise at least two holding systems positioned above and facing the lateral conveying systems and intended to be above the sheet of glass so as to limit the amplitude of the movements of the sheet of glass.

In what follows, the lateral holding systems may also be referred to as upper holding systems.

Advantageously, the conveying means further comprise at least one central conveying system, for preference two parallel and spaced-apart central conveying systems which are positioned between the lateral conveying conveyors, the sheet of glass being intended to face the central conveyors in its central part. The two lateral conveying systems are arranged in such a way as to lie one on each side of and some distance away from the central conveyor but close enough that all or part of the lateral sides of the sheet of glass projects beyond these lateral conveyors.

The lateral conveying systems and the central systems are driven at the same speed. When the holding systems are not fixed, they are also driven at the same speed.

What is meant by the lateral sides of the sheet of glass is the sides parallel to the direction of travel or of conveying of the sheet of glass and what is meant by upstream and downstream sides is the two opposite sides that are also substantially perpendicular to the lateral sides, upstream and downstream being understood with reference to the direction of travel.

The lateral conveying systems are intended to provide lateral support for the sheet of glass which, because of its curvature, rests at least at one point on its peripheral edge on each lateral conveyor. Because of its self-weight and flexibility the glass deforms usually enough for this support to be at two points.

The lateral holding systems are intended to prevent the sheet of glass from lifting when, under the effects of the pressurized water or air jets, it lifts off the lateral conveyors.

The sheet of glass rests at its periphery at one or two points on the lateral conveyors.

The point of support is the name given to a region at which the peripheral edge of the sheet of glass rests on the lateral conveying systems. Because the latter, which are of the belt type, are not wide, in practice having a width of 10 to 50 mm, this region of support is small in comparison with the periphery of the sheet of glass (measuring approximately 5 m) and can therefore be likened to a point contact.

The sheet of glass is intended to be supported by the central conveyor or conveyors and the lateral conveying systems on which its peripheral edge rests at point contacts. It is prevented or limited in its movement in relation to its position on these transporting conveyors by virtue of the upper holding systems which either limit its movement by being positioned 5 to 25 mm above the sheet of glass and therefore without touching it, or block its movement if said sheet of glasses touches them.

Thus, the sheet of glass intended to be conveyed and which may, if need be, rest via its edge at its upstream and downstream sides on a conventional central conveying system, is blocked or indeed limited in the amplitude of its vertical movements on the one hand downward by the fact that it rests on the lateral transport conveyors and on the other hand upward by each of the holding systems positioned above each respective lateral conveyor. In addition, because the holding systems touch the glass not at all or merely at points, they allow the entire surface area of the sheet of glass to be washed.

The device of the invention for conveying and holding a sheet of glass guarantees:
  stabilized transportation for all sheets of glass whatever the geometry of the contour of said sheet;
  protection of the edge face of the sheets of glass against any contact or shocks;
  distribution of supports over the entire periphery of the glazing forming the least possible impediment to access by the water and the air to the entirety of the surface and periphery of the sheets of glass.

In the remainder of the description, the terms "horizontal", "vertical", "upper", "lower", "top", "bottom", are to be understood to qualify elements of the device or of a sheet of glass when the device is resting fixedly on a horizontal plane and when the sheet of glass is associated with it also extending horizontally.

The term "height" when qualifying an element of the device is to be understood as meaning the vertical dimension, namely in a direction perpendicular to the horizontal plane containing the device.

The qualifier "lateral" is to be understood to mean a direction transverse (perpendicular) to the longitudinal conveying direction, namely direction of travel of the sheets of glass.

According to one feature, each holding system is a belt with a width of 10 to 100 mm and advantageously of 20 to 50 mm or a wire stretched over the sheet of glass with a diameter of 5 to 50 mm and for preference 10 to 30 mm and which moves with said sheet of glass without this movement being compulsory in the case where the belt or the wire does not touch the sheet of glass.

Thus, in one alternative form, the or each holding system is fixed and is not in contact with the sheet.

In another alternative form, the or each holding system moves at the speed of the sheet of glass and is in contact with the sheet of glass at points of contact or along lines of contact.

The or each holding system is advantageously a belt on which are distributed protuberances limiting contact with the sheet of glass to point contacts.

Thus, in the case of a belt, this belt may be covered with small protuberances in the shape of a cone, a hemisphere or a pyramid so as to limit contact between the belt and the sheet of glass to a point contact.

As an alternative, the or each holding system is a wire limiting contact with the sheet of glass to lines of contact. In the case of a wire, the wire will be smooth and because its diameter is small, contact between the wire and the sheet of glass will be limited to a line of contact the position of which will oscillate under the effect of the air and water jets, allowing the entire surface to be cleaned.

The wire has a diameter comprised between 5 and 50 mm, in particular between 10 and 30 mm.

What is meant by "point of contact" is a contact area of at most a few $mm^2$, particularly of at most 25 $mm^2$.

What is meant by "line of contact" is a contact area having a width of at most 3 mm. The length of the line is dependent on the curvature of the sheet of glass but is generally of the order of 50 mm.

Thus, the or each holding system is intended to generate local contact with the glass, such as in the form of at least one point of contact or at least one line of contact, for preference the area of contact is at most 25 $mm^2$ or the line of contact has a width of at most 3 mm.

The protuberances on the holding belt are evenly distributed so that there is no possible contact between the sheet of glass and the belt. In practice, the protuberances have a height comprised between 5 and 50 mm, for preference between 10 and 30 mm, and the protuberances are spaced apart by a distance of less than ten times their height, for preference less than five times their height.

Advantageously, the lateral conveying systems and the holding systems are adjustable laterally and heightwise to adapt to the size and curvature of the series of sheets of glass to be washed.

As a result, by adjusting the position of the lateral conveyors and holding systems, one and the same device of the invention can be used whatever the dimensions and curvature of the sheets of glass.

Advantageously, the holding systems have contact surfaces such as protuberances made of a plastics material of the polymer type that carries no risk of scratching the glass, for example with a Shore D hardness of less than 90 and sufficiently soft, for example of soft rubber, or in particular with a Shore A hardness comprised between 20 and 80, making it possible to adapt to the local curvature of the glass without applying too great a reaction force to the glass.

The invention also relates to an assembly comprising at least one central conveying system, two lateral conveying systems and two associated holding systems which are distant in the direction transverse to the conveying, characterized in that the lateral conveying device are arranged on either side of the central conveying device, the central conveying device and the lateral conveying systems being driven at the same speed.

The invention finally relates to a washing and drying facility comprising the aforementioned assembly or at least one conveying and holding device of the invention, particularly for cleaning sheets of glass, in particular curved glass for vehicle glazing such as of the windshield type.

For preference, the method of implementing the device of the invention is as follows, there generally being a central conveying device:

- the position (in a horizontal plane) and height of the lateral conveyor systems and holding systems is adjusted with the in a stationary position;
- the sheet or sheets of glass are brought by automated means over the conveying and holding device so that they become lodged on the lateral conveyors and possibly on the central conveying system;
- each sheet of glass is deposited on the central conveying device at least at four support points according to the curvature via its upstream and downstream edges, the concave face in the case of a curved sheet of glass facing toward the conveyer (downward);
- during this depositing of the sheet of glass, this sheet is pressed firmly against the lateral conveyors. Then, during conveying, before entering the washing machine, the sheet of glass becomes inserted under the holding systems.

Figure 2:
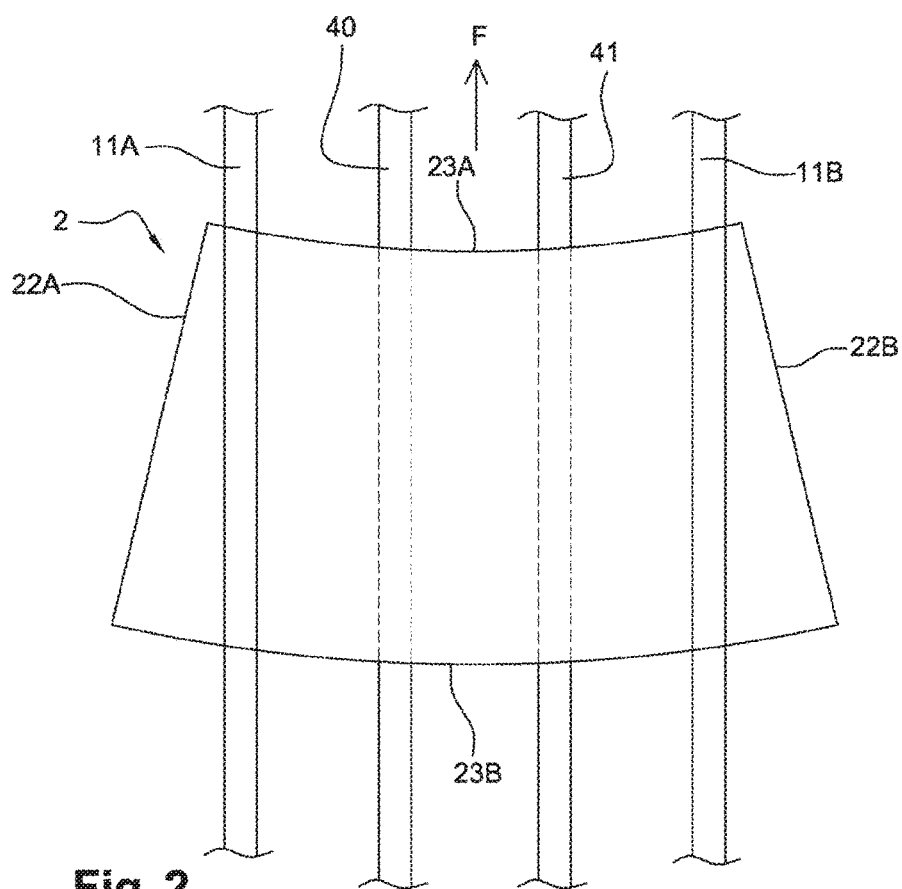
Figure 3:
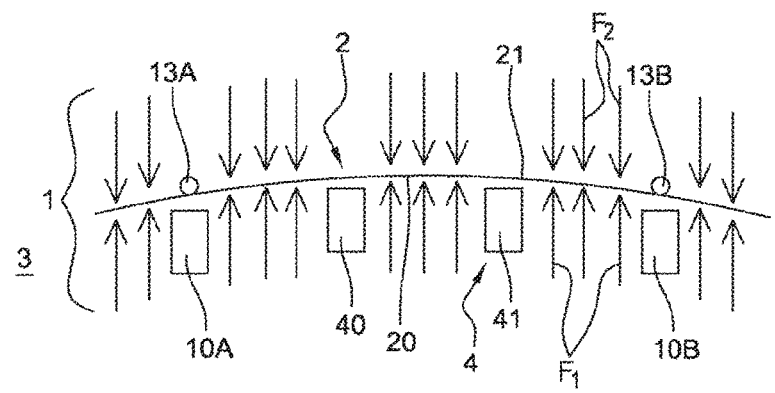
Figure 4:
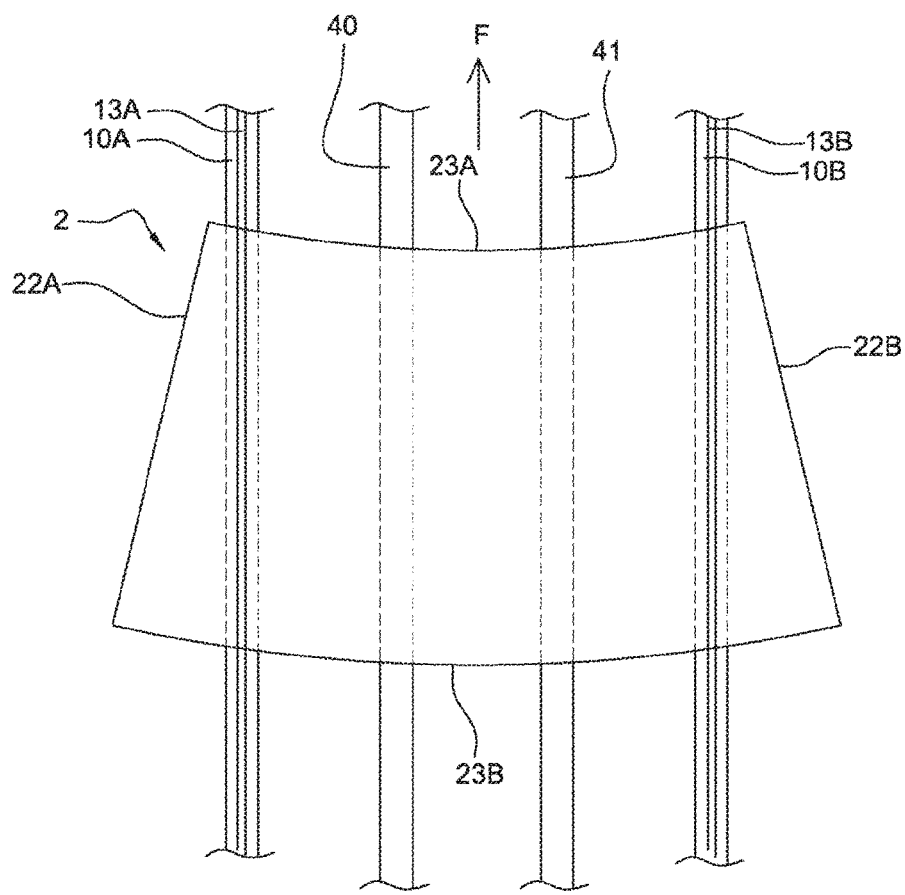

The present invention is now described with the aid of examples which are purely illustrative and do not in any way restrict the scope of the invention, and on the basis of the attached illustrations in which:

FIG. 1 depicts, in a washing facility, a schematic view in cross section of the conveying and holding device of the invention according to a first embodiment in the position of holding a sheet of glass, the view in cross section being a transverse section with respect to the longitudinal direction of conveying and situated in a vertical plane passing through the point of contact of the sheet of glass with the holding systems;

FIG. 2 is a schematic plan view of the conveying and holding device of the invention of FIG. 1;

FIG. 3 depicts, in a washing facility, a schematic view in cross section of the conveying and holding device of the invention according to a second embodiment in the position of holding a sheet of glass, the view in cross section being a transverse section with respect to the longitudinal direction of conveying and situated in a vertical plane passing through the point of contact of the sheet of glass, the holding systems being wires;

FIG. 4 is a schematic view from above of the conveying and holding device of the invention of FIG. 3.

The conveying and holding device 1 of the invention illustrated in FIGS. 1 and 2 or 3 and 4 has the purpose of holding a sheet of glass 2 in a substantially horizontal plane of conveying it or contributing to conveying it in a direction F and of holding it in position without any effect of amplitude or at the very least by minimizing these effects of amplitude when subjected to high vibrations on its two faces, in particular by water and air pressure jets.

FIG. 1 is a schematic illustration in cross section of a conveying and air-spraying facility 3 comprising the conveying and holding device 1 for conveying and holding a sheet of glass 2, comprising two parallel and spaced-apart lateral conveying systems 10A and 10B arranged laterally with respect to the sheet of glass 2, and for preference a central conveyer 4 comprising two drive belts 40 and 41 and positioned between the two lateral conveying systems 10A and 10B and water or air pressure jets symbolized by the arrows F1 and F2 directed vertically respectively upward and downward.

Furthermore, according to the invention, the device comprises holding systems 11A and 11B intended to block the lifting of the sheet of glass when, under the effect of the pressurized water or air jets, it lifts off the lateral conveyors 10A and 10B.

The sheet of glass 2 has two opposite faces, a lower face 20 and an upper face 21, extending horizontally, the lower face 20 faces downward. The sheet of glass comprises two opposite lateral sides 22A and 22B which are parallel to the direction of travel, and two other sides referred to as the upstream side 23A and downstream side 23B, which are transverse to the lateral sides. Conveying is in the direction of the arrow F (FIG. 2).

The sheet of glass 2 rests horizontally on the drive belts 40 and 41 via its edge at its upstream 23A and downstream 23B sides (at least at four points depending on its curvature).

The conveying and holding device 1 guarantees, via the holding systems 11A and 11B, that the sheet of glass 2 is held in this horizontal plane perpendicular to the jets.

The sheet of glass 2 in the example depicted is curved, the lower face 20 corresponding to the concave face 20.

The concavity of the sheet of glass therefore faces downward, which means to say faces the central conveyer 4.

The sheet of glass 2 therefore rests in its middle part via its lower face 20 on the central conveyer 4.

The lateral conveying systems are intended to provide lateral support to the sheet of glass which, because of its curvature, rests at least at one point on its peripheral edge on each lateral conveyor. In practice, because of its self-weight and flexibility, the glass usually deforms enough for this support to be at two, upstream and downstream, points on each lateral conveyor.

When the holding systems are in contact with the glass, this contact is at two point P1 and P2 as illustrated in FIG. 1.

The conveying systems 10A and 10B with their holding systems 11A and 11B are positioned by adjusting the holding elements before the start of the production run (the washing of sheets of glass), so as to support the shapes of sheets of glass (generally for windshields) of the coming production run.

The holding systems 11A and 11B are able to be adjusted in terms of position in a horizontal plane perpendicular to the axis of travel of the sheet of glass.

The holding systems 11A and 11B are, for example, belts.

For preference, the holding systems (such as belts) comprise protuberances 12 which constitute (localized) points of contact with the glass when the sheet of glass touches said holding systems.

The material of which the holding elements (protuberances) pressed against the glass are made is tailored to avoid the creation of rupture initiators when the glass experiences vibrations due to washing and to drying.

The protuberances which are made of a plastics material of the polymer type which does not risk scratching the glass, for example with a Shore D hardness of less than 90 and soft enough, for example being made of soft rubber, or in particular of a Shore A hardness comprised between 20 and 80, making it possible to adapt to suit the local curvature of the glass without exerting too great a reaction force on the glass.

The protuberances on the holding belt are evenly distributed so that there is no possible contact between the sheet of glass and the belt. In practice, the protuberances have a height comprised between 5 and 50 mm, for preference between 10 and 30 mm, and the protuberances are spaced apart by a distance of less than ten times their height, for preference less than five times their height.

The protuberances 12 are derived for example from notched surfaces or waves affording an alternation of ribs (protuberances) and voids which are parallel. The protuberances may have various geometries, such as pyramids the tops of which may or may not be truncated, spheres, hemispheres or other shapes.

FIGS. 3 and 4 correspond to an alternative form of embodiment of FIGS. 1 and 2. The holding systems here take the form of wires 13A and 13B.

The wires 13A and 13B limit the contact with the sheet of glass to lines of contact. In the case of a wire, the wire will be smooth and because its diameter is small, contact between the wire and the sheet of glass will be limited to a line of contact the position of which will oscillate under the effect of the water and air jets, allowing the entire surface to be cleaned.

The wire has a diameter comprised between 5 and 50 mm, in particular between 10 and 30 mm.

The invention claimed is:

1. A device for conveying and holding a sheet of glass, comprising a conveyor and a holder configured to hold a sheet of glass in position, wherein the conveyor comprises at least two spaced-apart and parallel lateral conveying systems, extending longitudinally in a conveying direction and intended to be positioned in such a way as to support lateral sides of the sheet of glass, and the holder comprises at least one holding system placed above the lateral conveying systems and above the sheet of glass and intended to limit an amplitude of the movements of the sheet of glass, wherein the or each holding system is a belt on which are distributed protuberances, and wherein each of the protuberances has a shape that limits contact between the belt and the sheet of glass, at a location of the protuberance, to a point contact.

2. The device as claimed in claim 1, wherein the holder comprises at least two holding systems positioned above and facing the lateral conveying systems and intended to be above the sheet of glass so as to limit the amplitude of the movements of the sheet of glass.

3. The device as claimed in claim 2, wherein the conveyor further comprises at least one central conveying system.

4. The device as claimed in claim 1, wherein the or each holding system is fixed and is not in contact with the sheet of glass.

5. The device as claimed in claim 1, wherein the or each holding system moves at a speed of the sheet of glass and is in contact with the sheet of glass at points of contact or along lines of contact.

6. The device as claimed in claim 1, wherein the protuberances have a height comprised between 5 and 50 mm, and the protuberances are spaced apart by a distance of less than ten times their height.

7. The device as claimed in claim 1, wherein the or each holding system is intended to generate local contact with the sheet of glass.

8. The device as claimed in claim 1, wherein the holding systems have contact surfaces that are made of a polymeric plastics material that carries no risk of scratching the sheet of glass, making it possible to adapt to the local curvature of the sheet of glass without applying too great a reaction force to the sheet of glass.

9. The device as claimed in claim 1, wherein the lateral conveying systems and the holding system are adjustable laterally and heightwise to adapt to the size and curvature of the series of sheets of glass.

10. A washing and drying facility comprising at least one holding device as claimed in claim 1 for cleaning sheets of glass for vehicle glazing.

11. The device as claimed in claim 1, wherein the holder is configured to hold the sheet of glass in a horizontal position.

12. The device as claimed in claim 2, wherein the conveyor comprises two parallel and spaced-apart central conveying systems which are positioned between the lateral conveying systems, the sheet of glass being intended to face the central conveying systems in its central part.

13. The device as claimed in claim 6, wherein the protuberances have a height comprised between 10 and 30 mm, and the protuberances are spaced apart by a distance of less than five times their height.

14. The device as claimed in claim 8, wherein the polymeric plastics material has a Shore D hardness of less than 90.

15. The device as claimed in claim 1, wherein at least one of the protuberances has a shape of a cone, a hemisphere or a pyramid.

16. The device as claimed in claim 1, wherein a contact area between the belt and the sheet of glass defined by the point contact is at most 25 $mm^2$.

17. The device as claimed in claim 1, wherein a width of the protuberance is less than a width of the belt.

18. A device for conveying and holding a sheet of glass, comprising a conveyor and a holder configured to hold a sheet of glass in position, wherein the conveyor comprises at least two spaced-apart and parallel lateral conveying systems, extending longitudinally in a conveying direction and intended to be positioned in such a way as to support lateral sides of the sheet of glass, and the holder comprises at least one holding system placed above the lateral conveying systems and above the sheet of glass and intended to limit an amplitude of the movements of the sheet of glass, wherein the or each holding system is a wire.

19. The device as claimed in claim 18, wherein the wire has a diameter comprised between 5 and 50 mm.

20. The device as claimed in claim 7, wherein the local contact is in the form of at least one point of contact or at least one line of contact.

21. The device as claimed in claim 20, wherein an area of contact is at most 25 $mm^2$ or the line of contact has a width of at most 3 mm.

* * * * *